(12) United States Patent
Smith et al.

(10) Patent No.: US 8,803,570 B2
(45) Date of Patent: Aug. 12, 2014

(54) MULTIPHASE ELECTRICAL POWER ASSIGNMENT AT MINIMAL LOSS

(75) Inventors: Lynn Smith, San Mateo, CA (US); Stacey Reineccius, San Francisco, CA (US)

(73) Assignee: STEM, Inc, Milbrae, CA (US)

( * ) Notice: Subject to any disclaimer, the term of this patent is extended or adjusted under 35 U.S.C. 154(b) by 0 days.

(21) Appl. No.: 13/339,821

(22) Filed: Dec. 29, 2011
(Under 37 CFR 1.47)

(65) Prior Publication Data
US 2013/0141142 A1    Jun. 6, 2013

(51) Int. Cl.
*H03L 7/00*    (2006.01)

(52) U.S. Cl.
USPC ............ 327/141; 327/2; 327/544; 323/207; 363/98

(58) Field of Classification Search
USPC ................ 327/141–163; 331/1/A, 15–17; 375/373–376
See application file for complete search history.

(56) References Cited

U.S. PATENT DOCUMENTS

| | | | |
|---|---|---|---|
| 4,121,147 A | 10/1978 | Becker et al. | |
| 4,287,465 A | 9/1981 | Godard et al. | |
| 4,399,396 A | 8/1983 | Hase | |
| 4,559,590 A | 12/1985 | Davidson | |
| 4,752,697 A | 6/1988 | Lyons et al. | |
| 4,847,745 A | 7/1989 | Shekhawat et al. | |
| 4,996,637 A | 2/1991 | Piechnick | |
| 5,262,931 A | 11/1993 | Vingsbo | |
| 5,274,571 A | 12/1993 | Hesse et al. | |
| 5,369,353 A * | 11/1994 | Erdman | 323/207 |
| 5,510,700 A | 4/1996 | Pomatto | |
| 5,594,318 A | 1/1997 | Nor et al. | |
| 5,595,506 A | 1/1997 | Robinson et al. | |
| 5,620,337 A | 4/1997 | Pruehs | |
| 5,909,367 A * | 6/1999 | Change | 363/163 |
| 6,015,314 A | 1/2000 | Benfante | |

(Continued)

FOREIGN PATENT DOCUMENTS

| EP | 2101403 A2 | 9/2009 |
|---|---|---|
| EP | 2 204 658 A1 | 7/2010 |

(Continued)

OTHER PUBLICATIONS

International Search Report, PCT/US2012/071706 dated May 17, 2013.

(Continued)

*Primary Examiner* — Brandon S Cole
(74) *Attorney, Agent, or Firm* — Patterson & Sheridan, LLP

(57) ABSTRACT

In a multiphase electrical power assignment, a processor: receives instructions to connect a bi-directional power device to a multiphase premise power source; determines that the power device is to be coupled to a target phase's phase connection; confirms that the power device is not coupled to any phase connections; and couples the power device to the phase connection, where the power device's power signal is synchronized with the phase connection's power signal. When the power device is in a connected state, the processor: issues a command to place each phase connection switch in an open state; in response to confirming that the phase connection switches are in the open state, issues commands to the power device so that a power signal of the power device will be synchronized with the target phase; and closes the phase connection switch corresponding to the target phase.

20 Claims, 4 Drawing Sheets

(56) References Cited

U.S. PATENT DOCUMENTS

| | | |
|---|---|---|
| 6,018,203 A | 1/2000 | David et al. |
| 6,059,605 A | 5/2000 | Robinson et al. |
| 6,160,722 A | 12/2000 | Thommes et al. |
| 6,172,480 B1 | 1/2001 | Vandelac |
| 6,200,158 B1 | 3/2001 | Robinson |
| 6,268,715 B1 | 7/2001 | Oglesbee et al. |
| 6,301,132 B1 | 10/2001 | Vandelac |
| 6,310,789 B1 | 10/2001 | Nebrigic et al. |
| 6,388,421 B2 | 5/2002 | Abe |
| 6,404,655 B1 | 6/2002 | Welches |
| 6,420,801 B1 | 7/2002 | Seefeldt |
| 6,424,119 B1 | 7/2002 | Nelson et al. |
| 6,429,625 B1 | 8/2002 | LeFevre et al. |
| 6,522,031 B2 | 2/2003 | Provanzana et al. |
| 6,587,362 B1 | 7/2003 | Vithayathil |
| 6,606,552 B2 | 8/2003 | Haimerl et al. |
| 6,639,383 B2 | 10/2003 | Nelson et al. |
| 6,750,685 B1 | 6/2004 | Guerrero Mercado |
| 7,019,666 B2 | 3/2006 | Tootoonian Mashhad et al. |
| 7,031,859 B2 | 4/2006 | Piesinger |
| 7,157,810 B2 | 1/2007 | Kanouda et al. |
| 7,199,527 B2 * | 4/2007 | Holman et al. ............... 313/511 |
| 7,248,490 B2 | 7/2007 | Olsen et al. |
| 7,262,694 B2 | 8/2007 | Olsen et al. |
| 7,385,373 B2 | 6/2008 | Doruk et al. |
| 7,456,519 B2 | 11/2008 | Takeda et al. |
| 7,676,334 B2 | 3/2010 | Matsuura et al. |
| 7,747,739 B2 | 6/2010 | Bridges et al. |
| 7,752,145 B2 | 7/2010 | Kelty |
| 7,804,183 B2 | 9/2010 | Arinaga |
| 7,933,695 B2 | 4/2011 | Yamaguchi |
| 8,053,921 B2 | 11/2011 | Ichikawa |
| 8,125,183 B2 | 2/2012 | Katsunaga |
| 8,149,114 B2 | 4/2012 | Hanft |
| 8,183,995 B2 | 5/2012 | Wang |
| 2002/0019758 A1 | 2/2002 | Scarpelli |
| 2002/0171436 A1 | 11/2002 | Russell |
| 2002/0173902 A1 | 11/2002 | Haimerl et al. |
| 2002/0190525 A1 | 12/2002 | Worden et al. |
| 2003/0007369 A1 | 1/2003 | Gilbreth et al. |
| 2003/0057919 A1 | 3/2003 | Yang |
| 2004/0062059 A1 | 4/2004 | Cheng et al. |
| 2004/0262996 A1 | 12/2004 | Olsen et al. |
| 2004/0263116 A1 | 12/2004 | Doruk et al. |
| 2005/0237844 A1 * | 10/2005 | Hyde ............................ 365/228 |
| 2006/0023478 A1 * | 2/2006 | Takeda et al. ................... 363/97 |
| 2007/0005195 A1 | 1/2007 | Pasquale et al. |
| 2007/0117436 A1 | 5/2007 | Davis |
| 2007/0145952 A1 | 6/2007 | Arcena |
| 2007/0200433 A1 | 8/2007 | Kelty |
| 2008/0012667 A1 | 1/2008 | Colsch et al. |
| 2008/0183408 A1 | 7/2008 | Matsuura et al. |
| 2008/0272934 A1 | 11/2008 | Wang et al. |
| 2009/0102424 A1 | 4/2009 | Tien et al. |
| 2009/0146423 A1 | 6/2009 | Arinaga |
| 2009/0160259 A1 * | 6/2009 | Naiknaware et al. ........... 307/82 |
| 2009/0288896 A1 | 11/2009 | Ichikawa |
| 2010/0034003 A1 * | 2/2010 | Rozman et al. ............... 363/171 |
| 2010/0082464 A1 | 4/2010 | Keefe |
| 2010/0114387 A1 | 5/2010 | Chassin |
| 2011/0221195 A1 * | 9/2011 | Raju ............................... 290/44 |
| 2012/0069619 A1 * | 3/2012 | Badger et al. ................. 363/141 |
| 2012/0319748 A1 * | 12/2012 | Luo ............................... 327/158 |
| 2013/0030588 A1 * | 1/2013 | Smith et al. ................... 700/295 |

FOREIGN PATENT DOCUMENTS

| | | |
|---|---|---|
| EP | 2 475 059 A1 | 7/2012 |
| JP | 2002-305842 A | 10/2002 |
| JP | 2006-141093 A | 6/2006 |
| JP | 2006-338889 A | 12/2006 |
| JP | 2008-141918 A | 6/2008 |
| JP | 2008-178215 A | 7/2008 |
| TW | 200849770 A | 12/2008 |

OTHER PUBLICATIONS

Chenier, Glen. Reversal of Fortune. Electronic, Design, Strategy, News. 2009. p. 62.

Cha et al. "A New Soft Switching Direct Converter for Residential Fuel Cell Power System", IAS 2004. 2:1172-1177.

Choe et al. "A Parallel Operation Algorithm with Power-Sharing Technique for FC Generation Systems". 2009.725-731.

M.A. Kai, "Lessons Learned from the Texas Synchrophasor Network", IEEE-PES Innovative Smart Grid Technologies Conference, Berlin, Oct. 14-17, 2012.

* cited by examiner

MULTIPHASE ELECTRICAL POWER ASSIGNMENT AT MINIMAL LOSS

CROSS-REFERENCE TO RELATED APPLICATIONS

The present application is related to co-pending U.S. patent application Ser. No. 13/339,848, filed on Dec. 29, 2011, entitled "Multiphase Electrical Power Constructions and Assignment at Minimal Loss".

BACKGROUND OF THE INVENTION

Traditional interconnections between energy sources or sinks (loads) for use or charging in AC power systems utilize fixed wiring connection assignments taken from a multiphase generation source. Typically these connection assignments are taken through a distribution panel on a premise (i.e., business, home, or other usage location), where each phase is broken out and subsidiary wiring circuits are run utilizing one or more source phases. As a result of this break out and lack of visibility and means of allocating loads or sources, the net load/source profile in a given premise installation is often unbalanced with an unequal amount of load on each of the phases. Having unbalanced loads results in significant reductions in generator efficiency as well as increased losses throughout an AC transmission and distribution system. Further, if an onsite generator, especially a variable output generator such as solar or wind, is connected to the AC system, its outputs tend to be balanced from the generator but is then attached to an unbalanced loading situation in its premise. This results in the unbalanced loading on each phase of supplied power, leading to significant inefficiencies.

BRIEF SUMMARY OF THE INVENTION

According to one embodiment of the present invention, a method for multiphase electrical power assignment comprises: (a) receiving instructions by a processor to connect a given bi-directional power device to a multiphase premise power source, wherein a plurality of phase connections are coupled to the multiphase premise power source; (b) based on the instructions, determining by the processor that the given bi-directional power device is to be coupled to a given phase connection of the plurality of phase connections; (c) confirming by the processor that the given bi-directional power device is not coupled to any of the plurality of phase connections; and (d)coupling the given bi-directional power device to the given phase connection, wherein a power signal of the given bi-directional power device is synchronized with a power signal of the given phase connection.

In one aspect of the present invention, the given bi-directional power device comprises a given AC power source/load device, wherein the determining (b) comprises: (b1) determining by the processor that a hot output of the given AC power source/load device is to be connected to a target phase of the multiphase premise power source; and (b2) placing the given AC power source/load device into an idle mode by the processor.

In one aspect of the present invention, a plurality of phase connection switches is coupled between the given AC power source/load device and the plurality of phase connections, wherein the confirming (c) and coupling (d) comprise: (c1) determining by the processor whether the given AC power source/load device is in a connected state; (c2) in response to determining that the given AC power source/load device is in the connected state, issuing a command by the processor to place each of the plurality of phase connection switches in an open state; (c3) confirming by the processor that each of the plurality of phase connection switches is in the open state; (d1) in response to confirming that each of the plurality of phase connection switches is in the open state, issuing commands to the given AC power source/load device by the processor so that a power signal of the given AC source/load device will be synchronized with the target phase; and (d2) closing a given phase connection switch of the plurality of phase connection switches corresponding to the target phase by the processor.

In one aspect of the present invention, the issuing (d1) and the closing (d2) comprise: (d1i) determining by the processor a frequency and zero crossing point of the target phase; (d1ii) issuing timing and control commands to the given AC power/source load device by the processor so that a frequency of the power signal of the given AC source/load device will be synchronized with the frequency of the target phase; and (d2i) issuing a command by the processor to a fixed logic coupled to the plurality of phase connection switches to close the given phase connection corresponding to the target phase at the zero crossing point of the target phase.

In one aspect of the present invention, the method further comprises: (e) confirming by the processor that each of the plurality of phase connection switches are in an appropriate state; and (f) in response to confirming that each of the plurality of phase connection switches are in the appropriate state by the processor, instructing the given AC source/load device to begin providing or drawing power.

In one aspect of the present invention, the coupling (d) further comprises: (d3) in response to confirming that one of the plurality of phase connection switches is not in the open state, issuing a fault by the processor.

System and computer program products corresponding to the above-summarized methods are also described and claimed herein.

DETAILED DESCRIPTION OF THE INVENTION

Figure 1:
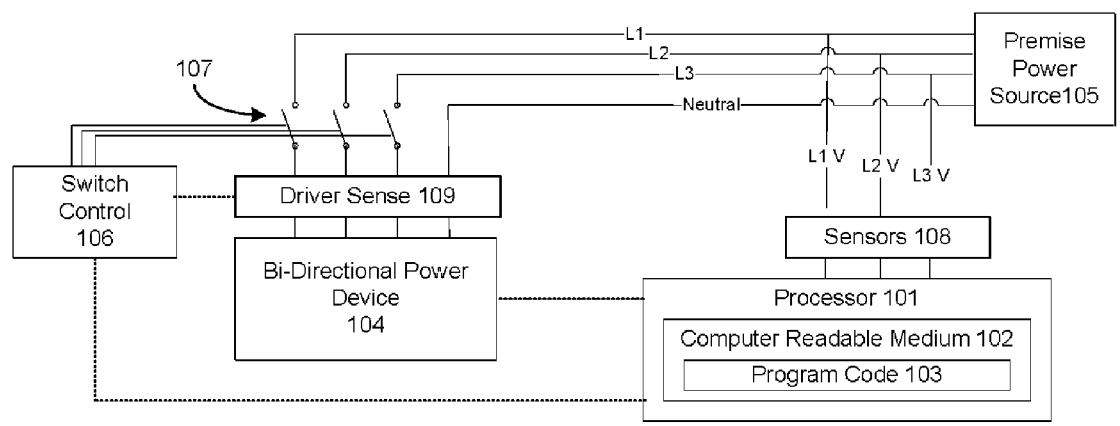
FIG. 1 illustrates an embodiment of a system for multiphase electrical power assignment according to the present invention.

The following description is presented to enable one of ordinary skill in the art to make and use the present invention and is provided in the context of a patent application and its requirements. Various modifications to the embodiment will be readily apparent to those skilled in the art and the generic principles herein may be applied to other embodiments. Thus, the present invention is not intended to be limited to the embodiment shown but is to be accorded the widest scope consistent with the principles and features described herein.

The present invention can take the form of an entirely hardware embodiment, an entirely software embodiment or an embodiment containing both hardware and software elements. In a preferred embodiment, the present invention is implemented in software, which includes but is not limited to firmware, resident software, microcode, etc.

Furthermore, the present invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, point devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified local function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 illustrates an embodiment of a system for multiphase electrical power assignment according to the present invention. The system comprises a processor 101 operationally coupled to a computer readable medium 102. The computer readable medium 102 stores computer readable program code 103 for implementing the method of the present invention. More specifically, the processor 101 controls the operations of a bi-directional power device 104 and a switch control logic 106. The system further comprises a premise power source 105 for providing multi-phase electrical power from the "grid". One or more bi-directional power devices 104 reside throughout the premises and are connected via local power lines to one of the phases of the premise power source 105. In this embodiment, the bi-direction power device 104 can either draw power from the connections or provide power to the connections. Sensors 108 coupled to the circuit connections at the premise power source 105 measure the voltage and current on the connections. Each connection provides power on one of a plurality of phases of power. FIG. 1 illustrates three phases of power (L1, L2, and L3), however, any number of phases may be used without departing from the spirit and scope of the present invention. In this embodiment, there is one set of sensors per phase of power, and measurements by the sensors 108 are accessible to the processor 101. Although the sensors 108 and the processor 101 are illustrated here as separate components, the sensors 108 may be incorporated with the processor 101 in the same component. The bi-directional power device 104 couples to a specific phase connection via switches 107. The phase connection switches 107 are controlled by the switch control logic 106, which is able to determine the status of each switch via a driver sense circuit 109.

Figure 2:
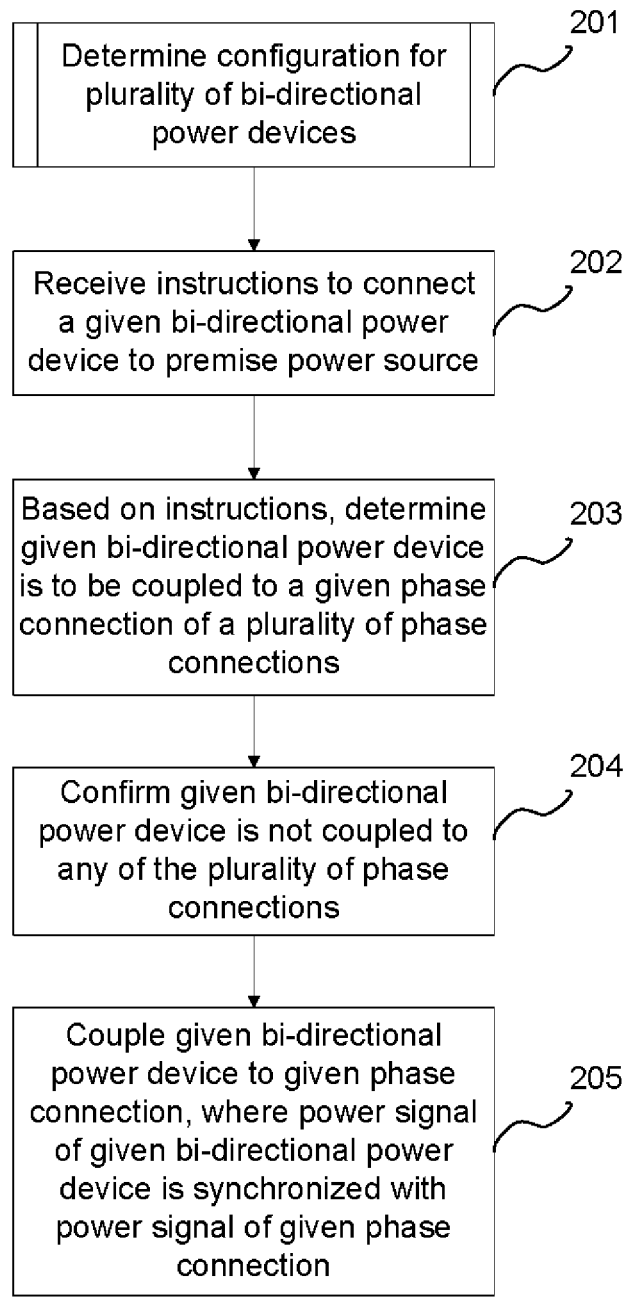
FIG. 2 is a flowchart illustrating an embodiment of a method for multiphase electrical power assignment according to the present invention.

FIG. 2 is a flowchart illustrating an embodiment of a method for multiphase electrical power assignment according to the present invention. In this embodiment, a separate logic (not shown) determines a configuration for the plurality of bi-directional power devices coupled to the premise power source 105 (201) for the purpose of balancing the charge and discharge of the power devices per phase. The processor 101 receives instructions from this logic on how to connect a given bi-directional power device 104 to the premise power source 105 (202). Based on these instructions, the processor 101 determines that the given bi-directional power device 104 is to be coupled to a given phase connection of the plurality of phase connections in the system (203). The processor 101 then confirms that the given bi-directional power device is not coupled to any of the plurality of phase connections (204). In this embodiment, the processor 101 determines the status of the phase connection switches 107 from the driver sense circuit 109 via the switch control logic 106. Prior to performing any connections, the processor 101 determines that the phase connection switches 107 are not coupled in order to avoid overlapping phase connections or state changes at other than the instructed time. After determining that the phase connection switches 107 are not coupled, the processor 101 couples the given bi-directional power device 104 to the given phase connection (205). In this embodiment, the processor 101 sends a command to the switch control logic 106 to close the phase connection switch 107 corresponding to the given phase connection. This connection is performed such that the power signal of the given bi-directional power device 104 is synchronized with the power signal of the given phase connection.

Figure 3:
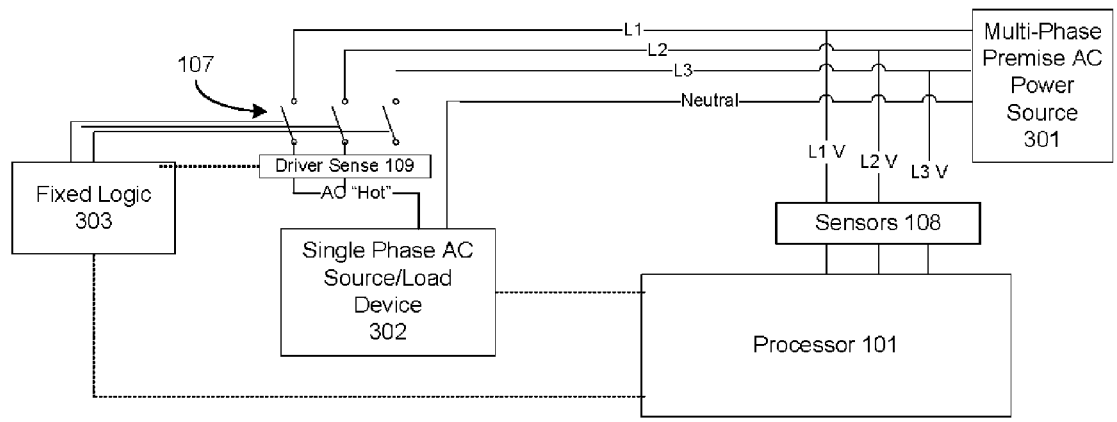
FIGS. 3 and 4 illustrate in more detail the embodiment of the system for multiphase electrical power assignment according to the present invention.
Figure 4:
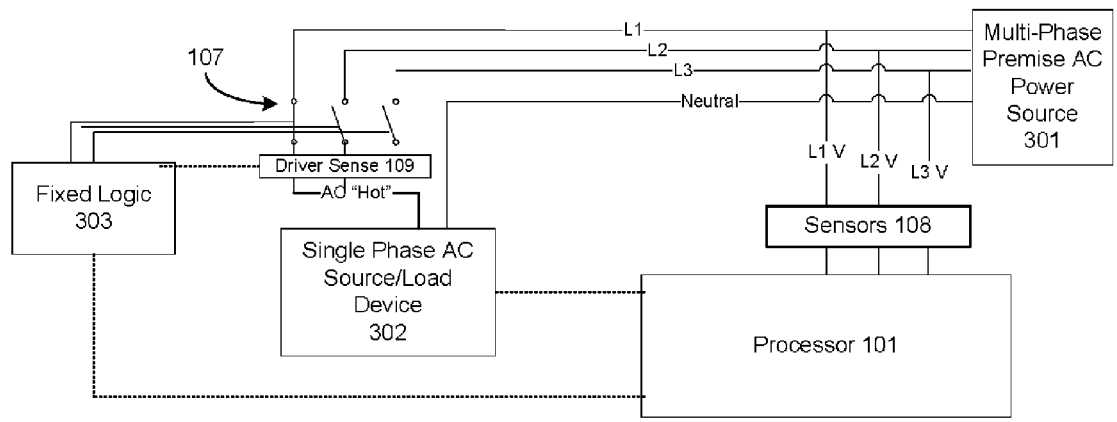

FIGS. 3 and 4 illustrate in more detail the embodiment of the system for multiphase electrical power assignment according to the present invention. In this embodiment, the premise power source 105 comprises a multi-phase AC power source 301, such as the power grid. The bi-directional power device 104 comprises a single phase, grid connectable, AC source/load device 302. The processor 101 is coupled to the sensors 108 and may comprise a microcontroller, a digital signal processor (DSP), or another appropriate processor type. The processor 101 may comprise a plurality of analog to digital conversion inputs, clocks, internal memory and other computational elements. The phase connection switches 107 comprise relay circuits, with each switch connected between the "hot" output of the AC source/load device 302 and one of the phase connections (L1, L2, L3). One set of sensors 108 are coupled to each phase connection, where the sensors 108 are measuring the voltage and current on each phase connection. The processor 101 controls the operation of the AC source/load device 302 via control signals. The switch control logic 106 comprises a fixed logic device 303 which receives instructions from the processor 101 to close or open each of the switches 107. The switch control logic 106 contains logic to prevent the phase connection switches 107 from overlapping their connections or changing state at other than the instructed time. The driver sense circuit 109 measures the actual states of the phase connection switches 107 and sends the states to the processor 101 via the fixed logic 303. This allows the processor 101 to validate the actual states of the phase connection switches 107 and to compare the actual states with the intended states. FIG. 3 illustrates the system with the AC source/load device 302 in a disconnected mode, i.e., all phase connection switches open. FIG. 4 illustrates the system with the AC source/load device 302 connected to the L1 phase connection, i.e., with only the switch corresponding to the L1 phase closed.

Figure 5:
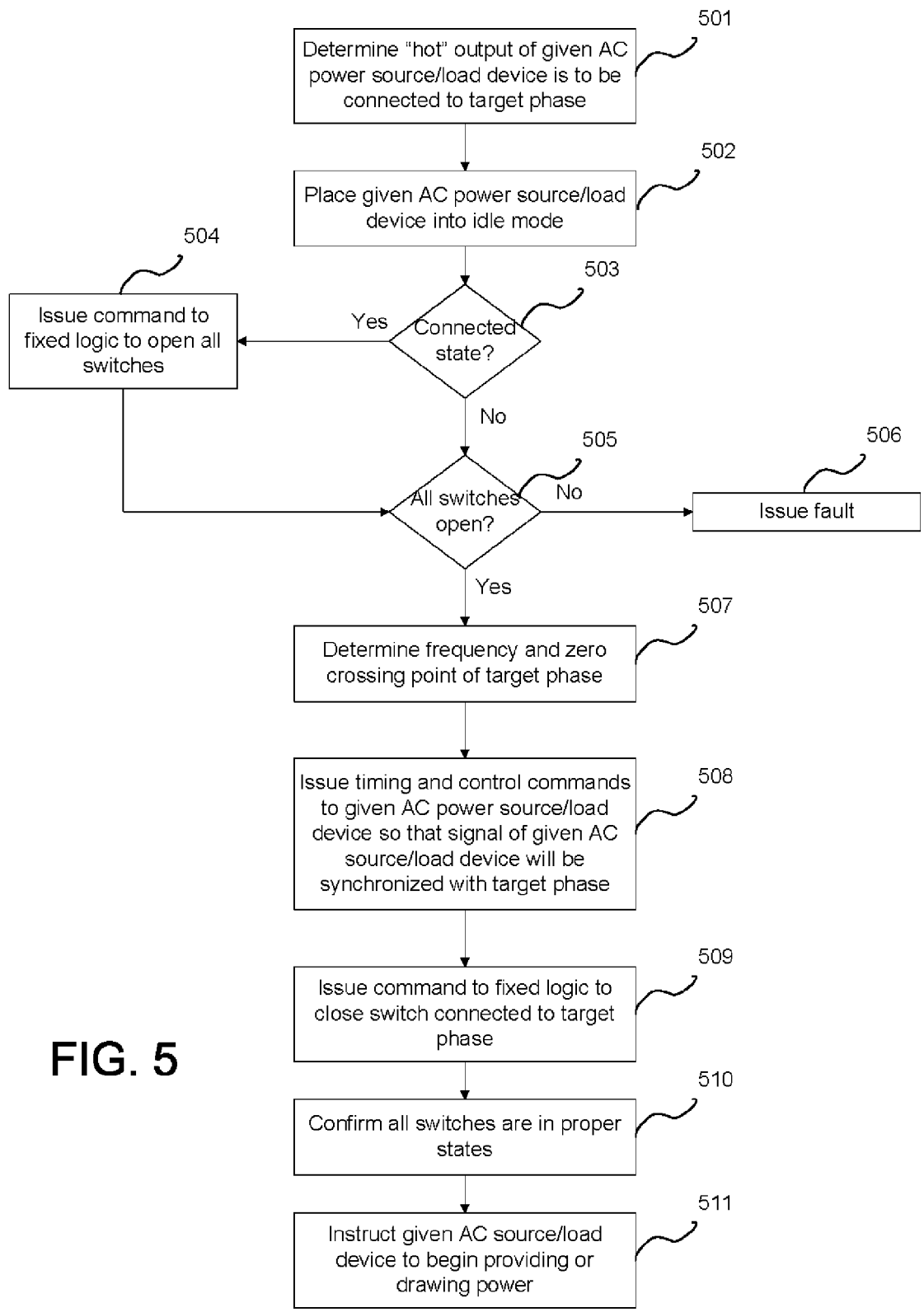
FIG. 5 is a flowchart illustrating in more detail the embodiment of the method for multiphase electrical power assignment according to the present invention.

FIG. 5 is a flowchart illustrating in more detail the embodiment of the method for multiphase electrical power assignment according to the present invention. Referring to FIGS. 3-5, the processor 101 determines that the "hot" output of a given AC source/load device 302 is to be connected to a target phase (501). Assume here that the target phase is L1. In this embodiment, the processor 101 makes this determination based on the instructions received from the separate logic, as described above with reference to 202 of FIG. 2. The processor 101 then places the given AC source/load device 302 into an idle mode (502). In the idle mode, there is zero voltage difference between the given AC source/load device 302 and the AC power source 301, which prevents current flow. The processor 101 is also continuously tracking the frequencies of the AC power source 301 in order to maintain synchronization, as described further below.

The processor 101 next determines the current state of the given AC source/load device 302. If the given AC source/load device 302 is determined to be in a disconnected state, i.e., not connected to the AC power source 301, the processor 101 determines whether each phase connection switch 107 is open (505). In this embodiment, the processor 101 makes this determination from the states of the phase connection switches 107 as received from the driver sense circuit 109. The driver sense circuit 109 compares the voltage across each switch with the grid voltage to determine whether the grid voltage is seen across the switch. If any of the phase connection switches 107 are in a closed state, then a fault is issued (506).

If the given AC source/load device 302 is determined to be in a connected state, then the processor 101 issues a command to the fixed logic 303 to open all of the phase connection switches 107 (504). The processor 101 then attempts to confirm that each of the phase connection switches 107 is in an open state (505). If any of the phase connection switches 107 are still in a closed state, then a fault is issued (506).

When the processor 101 confirms that each of the phase connection switches 107 are in an open state, the processor 101 uses the inputs from the sensors 108 to determine the frequency and zero crossing point of the target phase L1 (507). The processor 101 issues timing and control commands to the given AC power source/load device 302 so that the given AC source/load device 302 and the target phase L1 will be synchronized once connected. The timing and control commands allow the given AC power source/load device 302 to synchronize to the same frequency and voltage as the target phase L1. Stress on a switch may be reduced by closing the switch at the zero crossing point of the target phase. The processor 101 then issues a command to the fixed logic 303 to close the phase connection switch 107 connected to the target phase L1 (509). In this embodiment, the fixed logic 303 ensures that only one switch at a time can be closed and that adequate delay is present to assure that all switches are open before a switch is closed. The fixed logic 303 then enables the control signal line to cause the switch 107 corresponding to the target phase L1 to close. (See FIG. 4.) The processor 101 then confirms that all of the phase connection switches 107 are in their proper states (510) via the states measured by the driver sense 109. Once the processor 101 makes this confirmation, the processor 101 instructs the given AC source/load device 302 to begin providing or drawing power (511).

A method and system for multiphase electrical power assignment have been disclosed. The embodiments of the present invention provides for the measurement, determination, and application of phase specific AC power for charge or discharge to a correct phase for use in a more efficient and balanced manner.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for balancing the amount of power flowing through phases of a multiphase premises power source, comprising:
   (a) determining that there is an imbalance in an amount of power flowing through a first phase and a second phase of a plurality of phases of a multiphase premises power source; and
   (b) delivering a power signal to the first phase using a bi-directional power device, wherein an amount of power delivered in the power signal from the bi-directional power device is derived from the determined imbalance in the amount of power flowing through the first phase and the second phase.

2. The method of claim 1, wherein the bi-directional power device comprises an AC power source/load device, wherein the determining (a) further comprises:
   (a1) determining that a hot output of the AC power source/load device is to be connected to the first phase of the plurality of phases using a processor; and
   (a2) placing the AC power source/load device into an idle mode by the processor.

3. The method of claim 1, wherein the bi-directional power device comprises an AC power source/load device, and a plurality of phase connection switches are coupled between the AC power source/load device and the plurality of phases, and the method further comprising:
- confirming that the bi-directional power device is not coupled to any of the plurality of phases using the processor, wherein confirming comprises:
  - determining whether the AC power source/load device is in a connected state using a processor;
  - in response to determining that the AC power source/load device is in the connected state, issuing a command to place each of the plurality of phase connection switches in an open state using the processor;
  - determining that each of the plurality of phase connection switches is in the open state using the processor,
- in response to confirming that each of the plurality of phase connection switches is in the open state, issuing commands to the AC power source/load device so that a power signal of the AC source/load device will be synchronized with the first phase using the processor; and
- closing a first phase connection switch of the plurality of phase connection switches corresponding to the first phase by the processor.

4. The method of claim 3, further comprising:
- determining a frequency and zero crossing point of the first phase using the processor;
- issuing timing and control commands to the AC power/source load device-so that a frequency of the power signal of the AC source/load device will be synchronized with the frequency of the first phase using the processor; and
- issuing a command by the processor to a fixed logic coupled to the plurality of phase connection switches to close the first phase connection corresponding to the first phase at the zero crossing point of the first phase.

5. The method of claim 3, further comprising:
- confirming that each of the plurality of phase connection switches are in an appropriate state using the processor; and
- in response to confirming that each of the plurality of phase connection switches are in the appropriate state by the processor, instructing the AC source/load device to begin providing or drawing power.

6. A computer program product for balancing the amount of power flowing through phases of a multiphase premises power source, the computer program product comprising:
- a non-transitory computer readable medium having computer readable program code embodied therewith, the computer readable program code configured to:
- determine that there is an imbalance in the amount of power flowing through a first phase and a second phase of a plurality of phases of a multiphase premises power source; and
- delivering a power signal to the first phase using a bi-directional power device, wherein an amount of power delivered in the power signal of the bi-directional power device is derived from the determined imbalance in the amount of power flowing through the first phase and the second phase.

7. The computer program product of claim 6, wherein the bi-directional power device comprises a AC power source/load device, wherein the computer readable program code configured to determine that the bi-directional power device is to be coupled to the first phase is further configured to:
- determine a hot output of the AC power source/load device is to be connected to the first phase of the multiphase premises power source; and
- place the AC power source/load device into an idle mode using a processor.

8. The computer program product of claim 7, wherein a plurality of phase connection switches is coupled between the AC power source/load device and the plurality of phases, wherein the computer readable program code is further configured to confirm that the bi-directional power device is not coupled to any of the plurality of phases and to couple the bi-directional power device to the phase, wherein the method further comprises:
- determine whether the AC power source/load device is in a connected state;
- in response to determining that the AC power source/load device is in the connected state, issue a command to place each of the plurality of phase connection switches in an open state;
- confirm that each of the plurality of phase connection switches is in the open state;
- in response to confirming that each of the plurality of phase connection switches is in the open state, issue commands to the AC power source/load device so that a power signal of the AC source/load device will be synchronized with the first phase; and
- close a first phase connection switch of the plurality of phase connection switches corresponding to the first phase.

9. The computer program product of claim 8, wherein the computer readable program code configured to issue commands to the AC power source/load device so that the power signal of the AC source/load device will be synchronized with the first phase and to close the first phase connection switch of the plurality of phase connection switches corresponding to the first phase are further configured to:
- determine a frequency and zero crossing point of the power signal of the first phase;
- issue timing and control commands to the AC power/source load device so that a frequency of the power signal of the AC source/load device will be synchronized with the frequency of the power signal of the first phase; and
- issue a command to a fixed logic coupled to the plurality of phase connection switches to close the first phase connection switch corresponding to the first phase at the zero crossing point of the power signal of the first phase.

10. The computer program product of claim 8, wherein the computer readable program code is further configured to:
- confirm that each of the plurality of phase connection switches are in an appropriate state; and
- in response to confirming that each of the plurality of phase connection switches are in the appropriate state, instruct the AC source/load device to begin providing or drawing power.

11. A system, comprising:
- a plurality of power phase connections coupled to a multiphase premises power source;
- a bi-directional power device;
- a plurality of phase connection switches coupled to the bi-directional power device is and the plurality of power phase connections; and
- a processor operationally coupled to a computer readable medium having computer readable program code embodied therewith, the computer readable program configured to:
  - determine that there is an imbalance in an amount of power flowing through a first phase and a second phase of a plurality of phases; and delivering a power signal to the first phase using the bi-directional power device by closing a first phase connection switch that is coupled to the first phase and the bi directional power device, wherein an amount of power delivered in the power signal from the bi-directional power device is derived from the determined imbalance in the amount of power flowing through the first phase and the second phase.

12. The system of claim 11, wherein the bi-directional power device comprises an AC power source/load device, wherein the computer readable program code configured to determine that the bi-directional power device is to be coupled to the first phase is further configured to:
  determine a hot output of the AC power source/load device is to be connected to a first phase of the multiphase premises power source; and
  place the AC power source/load device into an idle mode using the processor.

13. The system of claim 12, wherein the computer readable program code is further configured:
  to confirm that the bi-directional power device is not coupled to any of the plurality of phase connections,
  to couple the bi-directional power device to the first phase connection;
  determine whether the AC power source/load device is in a connected state;
  in response to determining that the AC power source/load device is in the connected state, issue a command to place each of the plurality of phase connection switches in an open state;
  confirm that each of the plurality of phase connection switches is in the open state;
  in response to confirming that each of the plurality of phase connection switches is in the open state, issue commands to the AC power source/load device so that a power signal of the AC source/load device will be synchronized with the first phase; and
  close a first phase connection switch of the plurality of phase connection switches corresponding to the first phase.

14. The system of claim 13, further comprising a fixed logic coupled to the plurality of phase connection switches and the processor, wherein the computer readable program code configured to issue commands to the AC power source/load device so that the power signal of the AC source/load device will be synchronized with the first phase and to close the first phase connection switch of the plurality of phase connection switches corresponding to the first phase are further configured to:
  determine a frequency and zero crossing point of the power signal of the first phase;
  issue timing and control commands to the AC power/source load device so that a frequency of the power signal of the AC source/load device will be synchronized with the frequency of the power signal of the first phase; and
  issue a command to the fixed logic to close the first phase connection switch corresponding to the first phase at the zero crossing point of the power signal of the first phase.

15. The system of claim 13, wherein the computer readable program code is further configured to:
  confirm that each of the plurality of phase connection switches are in an appropriate state; and
  in response to confirming that each of the plurality of phase connection switches are in the appropriate state, instruct the AC source/load device to begin providing or drawing power.

16. A method of balancing the amount of power flowing through phases of a multiphase premises power source, comprising:
  determining that there is an imbalance in power flowing through at least one of a plurality of phases of the multiphase premises power source that are in electrical communication to a multiphase electrical power grid; and
  delivering a power signal to the at least one phase using a bi-directional power device based on the determined imbalance in power flowing through the at least one phase and another phase of the plurality of phases.

17. The method of claim 16, wherein determining that there is the imbalance in power flowing through at least one of the plurality of phases further comprises receiving instructions to connect the bi-directional power device to at least one phase of the multiphase premises power source using a processor.

18. The method of claim 17, further comprising determining if the bi-directional power device is coupled to any of the plurality of phase connections using the processor.

19. The method of claim 16, wherein delivering a power signal to the at least one phase using a bi-directional power device further comprises closing a phase connection switch that is coupled to the at least one phase, and wherein at least one phase connection switch is connected to each of the phases of the plurality of phases, and the power signal delivered by the bi-directional power device is synchronized with a power signal of the at least one phase.

20. The method of claim 1, wherein determining that a bi-directional power device is to be coupled to a first phase further comprises receiving instructions to connect the bi-directional power device to the first phase; and the method further comprises:
  confirming by the processor that the bi-directional power device is not coupled to any of the plurality of phase connections before delivering the power signal to the first phase.

* * * * *